(12) United States Patent
Moreno et al.

(10) Patent No.: US 7,821,095 B2
(45) Date of Patent: Oct. 26, 2010

(54) METHOD OF FORMING A SCHOTTKY DIODE AND STRUCTURE THEREFOR

(75) Inventors: Rogelio J. Moreno, Queen Creek, AZ (US); Linghui Chen, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 952 days.

(21) Appl. No.: 11/457,678

(22) Filed: Jul. 14, 2006

(65) Prior Publication Data
US 2008/0012089 A1 Jan. 17, 2008

(51) Int. Cl.
*H01L 29/66* (2006.01)
(52) U.S. Cl. ............................... 257/483; 257/E21.359
(58) Field of Classification Search ............... 257/483, 257/E21.359
See application file for complete search history.

(56) References Cited

U.S. PATENT DOCUMENTS

| | | | |
|---|---|---|---|
| 4,357,178 A | 11/1982 | Bergeron et al. | |
| 4,692,991 A * | 9/1987 | Flowers | 438/571 |
| 4,720,734 A | 1/1988 | Amemiya et al. | |
| 4,899,199 A * | 2/1990 | Gould | 257/484 |
| 5,060,047 A * | 10/1991 | Jaume et al. | 257/489 |
| 5,075,740 A | 12/1991 | Ohtsuka et al. | |
| 5,497,311 A | 3/1996 | Hanawaka | |
| 5,614,755 A | 3/1997 | Hutter et al. | |
| 5,859,465 A | 1/1999 | Spring et al. | |
| 6,624,472 B2 | 9/2003 | Hurkx et al. | |
| 6,660,570 B2 | 12/2003 | Kim et al. | |

OTHER PUBLICATIONS

Data Sheet: "NCP1205 Single Ended PWM Controller Featuring QR Operation and Soft Frequency Foldback", © Semiconductor Components Industries, LLC, Oct. 2005, 2005—Rev. 6, 17pps.

* cited by examiner

*Primary Examiner*—Bradley K Smith
*Assistant Examiner*—Amar Movva
(74) *Attorney, Agent, or Firm*—Robert F. Hightower

(57) ABSTRACT

In one embodiment, a Schottky diode is formed on a doped region having a thickness less than about eighteen microns.

10 Claims, 5 Drawing Sheets

__US 7,821,095 B2__

METHOD OF FORMING A SCHOTTKY DIODE AND STRUCTURE THEREFOR

This application is related to an application entitled "SCHOTTKY DIODE AND METHOD OF MANUFACTURE" filed on Mar. 21, 2005 as application Ser. No. 11/084,524, having at least one common inventor, a common assignee.

BACKGROUND OF THE INVENTION

The present invention relates, in general, to electronics, and more particularly, to methods of forming semiconductor devices and structure.

In the past, the semiconductor industry utilized various methods and structures for forming Schottky diodes. Schottky diodes were frequently used in low voltage/high frequency applications because the low forward voltage provided very fast switching characteristics. There was an increasing interest in Schottky diodes with low forward voltage. However, lowering the forward voltage drop usually resulted in decreasing the reverse breakdown voltage of the Schottky diode.

Accordingly, it is desirable to have a method of making a Schottky diode with a low forward voltage drop without reducing the reverse breakdown voltage.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. For clarity of the drawings, doped regions of device structures are illustrated as having generally straight line edges and precise angular corners. However, those skilled in the art understand that due to the diffusion and activation of dopants, the edges of doped regions generally may not be straight lines and the corners may not be precise angles.

DETAILED DESCRIPTION OF THE DRAWINGS

Figure 1:
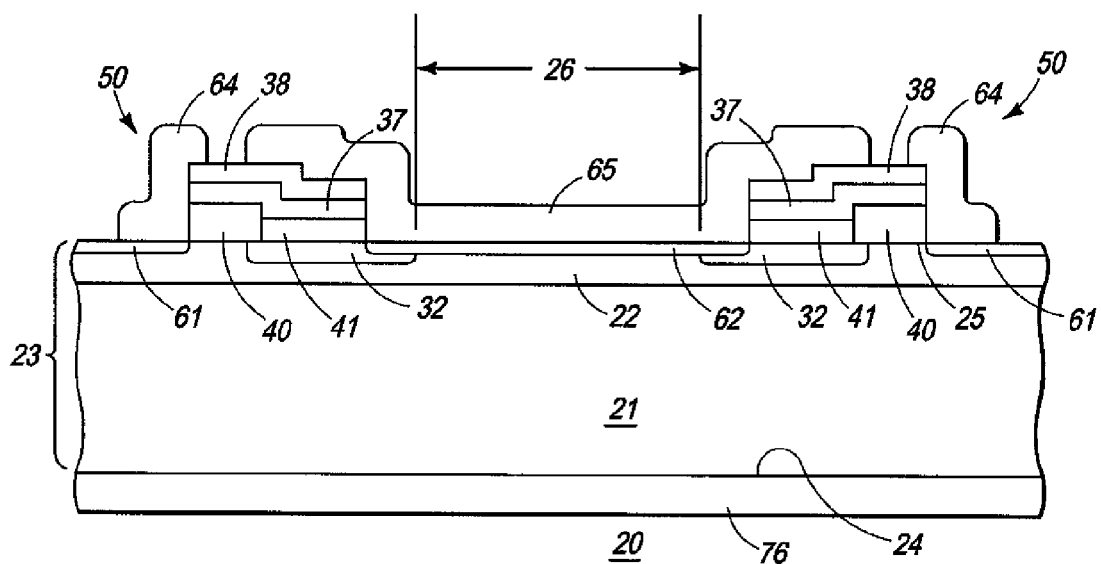
FIG. 1 illustrates an enlarged cross-sectional portion of an embodiment of a Schottky diode in accordance with the present invention.

FIG. 1 illustrates an enlarged cross-sectional portion of an embodiment of a Schottky diode 20 that has a low forward voltage drop and a high reverse breakdown voltage. Diode 20 includes an E-field spreading structure 50 that spreads out the E-field and facilitates reducing the forward voltage without reducing the reverse breakdown voltage. As will be seen further hereinafter, structure 50 includes a semi-insulating material that is formed adjacent to a dielectric material. Diode 20 generally is formed on a semiconductor substrate 23 that has a top surface 25 and a bottom surface 24. Semiconductor substrate 23 usually includes a bulk semiconductor substrate 21 that has an epitaxial layer 22 formed on a surface of substrate 21. Epitaxial layer 22 is a doped region that has also has a low resistivity.

Figure 2:
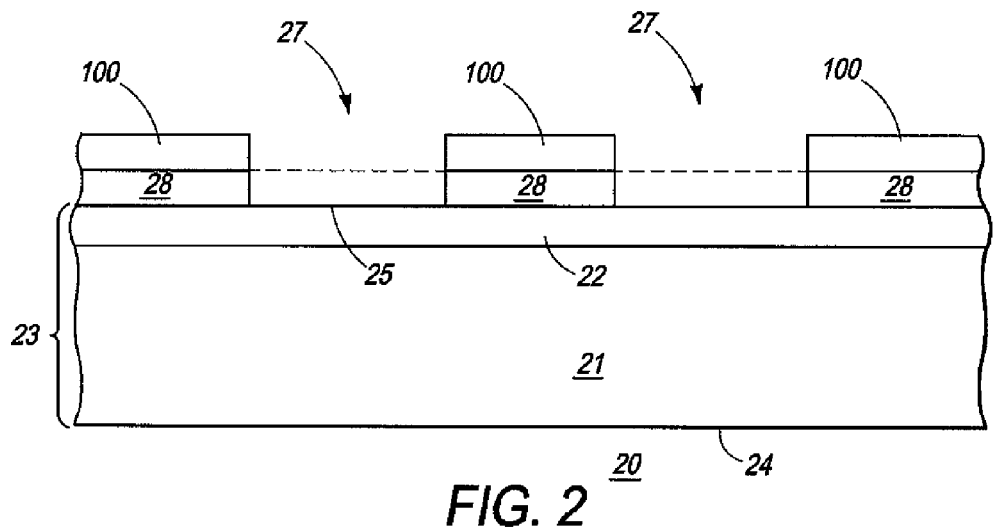
FIG. 2 illustrates an enlarged cross-sectional portion of the Schottky diode of FIG. 1 at an early stage of a method of forming the Schottky diode in accordance with the present invention.

FIG. 2 illustrates an enlarged cross-sectional portion of diode 20 and an early stage of a method of formation. Epitaxial layer 22 is formed on a first surface of bulk substrate 21. The thickness of layer 22 is less than about eighteen (18) microns and preferably is about 1.7 to 15.0 microns. Bulk substrate 21 and layer 22 typically are formed from the same conductivity type of semiconductor material, preferably N-type, with layer 22 having a higher resistivity than substrate 21. For example, the resistivity of layer 22 usually is less than about four (4) ohm-centimeter and preferably is in a range of about 0.2 to 2.0 ohm-cm. Such resistivity and thickness result in a forward voltage of about two hundred fifty to three hundred milli-volts (250-300 mv) and a reverse breakdown voltage that is less than about two hundred volts (200 V) and preferably is about ten to two hundred volts (10-200 V). The semi-insulating material of structure 50 facilitates forming layer 22 with such thickness and resistivity thereby facilitates forming diode 20 with the low forward voltage drop without reducing the reverse breakdown voltage. In one embodiment, layer 22 is epitaxially formed on substrate 21 to have a phosphorus doping concentration that is greater than about 1E15 atoms/cm$^3$ and preferably is about 2E15 to 1E10 atoms/cm$^3$. Those skilled in the art will appreciate that layer 22 is optional and may be replaced by other structures. For example, a portion of the top surface of bulk substrate 21 may be doped to form a doped region having a thickness and resistivity that is similar to the thickness and resistivity of epitaxial layer 22. Additionally, layer 22 and substrate 21 may be doped with P-type dopants instead of N-type dopants.

A dielectric layer 28 may be formed on surface 25 of substrate 23. As will be seen further hereinafter, a portion of layer 28 is used as a portion of structure 50. Dashed lines illustrate portions of layer 28 that are removed during the operations explained in the description of FIG. 2. Suitable materials for layer 28 include silicon dioxide, silicon nitride, silicon oxide-nitride, silicon carbide, or other well-known dielectric materials. Layer 28 may be formed by a variety of well-known techniques including chemical vapor deposition (CVD), thermal oxide growth, and oxide deposition. Subsequently, a mask 100, such as a photolithographic mask, is formed on layer 28 and patterned to expose a portion of dielectric layer 28 where a doped region 32 is to be formed. Mask 100 is utilized to form openings 27 through the portions of layer 28 overlying the portion of substrate 23 where doped region 32 is to be formed. Openings 27 generally are formed by etching the exposed portions of layer 28 by techniques that are well known to those skilled in the art, for example, by an anisotropic reactive ion etch.

Figure 3:
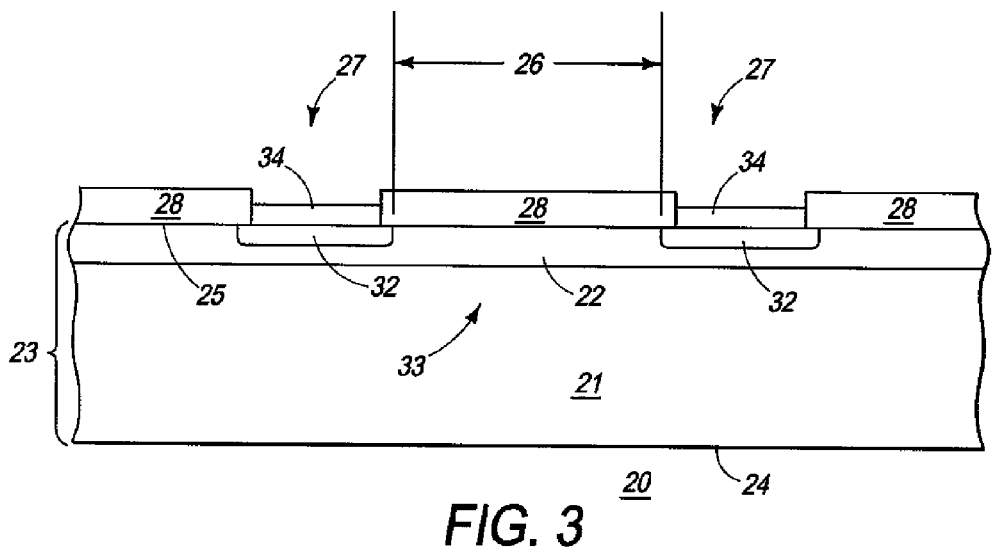
FIG. 3-FIG. 8 illustrate enlarged cross-sectional portions of the Schottky diode of FIG. 1 at subsequent stages of a method of forming the Schottky diode of FIG. 1 in accordance with the present invention.

Referring to FIG. 3, mask 100 is removed leaving the remaining portions of layer 28 on surface 25. The portion of layer 22 that is exposed within openings 27 is doped to form a doped region 32 that extends from surface 25 a distance into layer 22 that is less than the thickness of layer 22. In most embodiments, region 32 is formed in a multiply-connected topology such as a donut or other connected shape having an opening in it. For a multiply-connected topology, the portion of the shape enclosed by the inner periphery of region 32 will subsequently become an active region 26 of diode 20. Those skilled in the art will appreciate that the shape formed by doped regions 32 may be any of a variety of multiply-connected shapes including a circular doughnut, a triangle, a square, or other shape. The shape formed by region 32 may also have other shapes that are not multiply-connected as long as region 32 forms a boundary of active region 26.

A dielectric 34 is formed on surface 25 to abut layer 28 and overlie a portion of region 32. Dielectric 34 generally has a thickness that is less than the thickness of layer 28 and may be in the range of about fifty to ten thousand (50-10000) micrometers. During the formation of dielectric 34, the thickness of layer 28 may be increased. Layer 34 may be formed as a by-product of forming region 32 or may be formed by other well-known methods.

Figure 4:
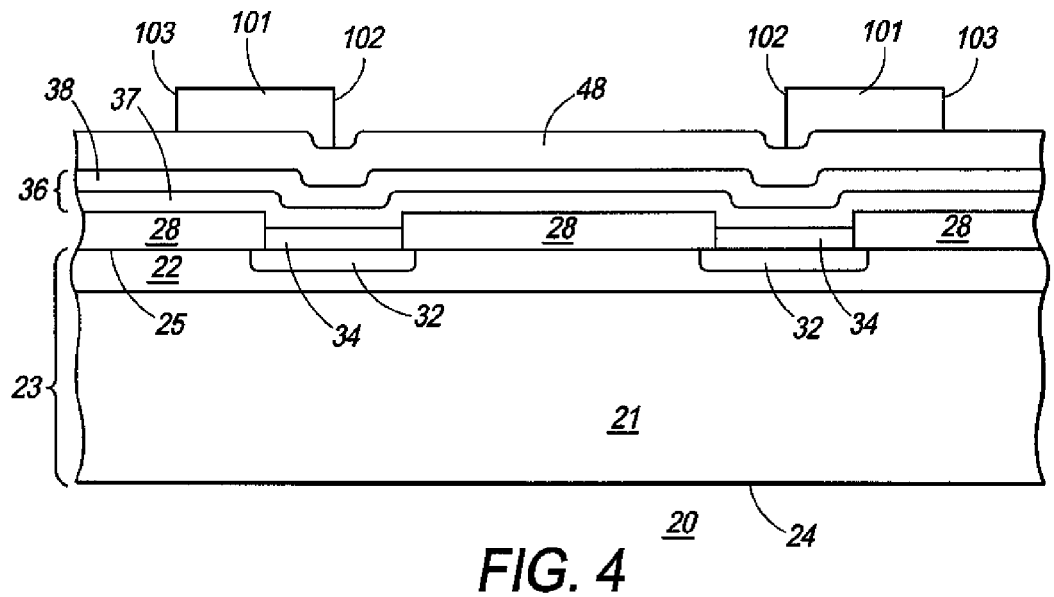

Referring to FIG. 4, a semi-insulating semiconductor material 36 is formed on layer 28 and dielectric 34. In most embodiments, material 36 is formed from a plurality of layers of semi-insulating semiconductor material that may have different resistivity, although, material 36 may have only one layer of semi-insulating material in some embodiments. Preferably, material 36 has at least a first semi-insulating layer 37 that is formed on layer 28 and dielectric 34, and a second semi-insulating layer 38 that is formed on layer 37. Layer 38 generally has a higher resistivity than layer 37 in order to assist in spreading the E-field formed near region 32. A semi-insulating semiconductor material is a semiconductor material that has a resistivity that is greater than about 2E17 ohm-cm. Suitable materials that may be used to form layers 37 and 38 include polycrystalline silicon (polysilicon) having a carrier concentration of less than about 1E10 atoms/cm$^3$ and alpha-silicon having a carrier concentration of less than about 1E10 atoms/cm$^3$. A protective layer 48 is formed on material 36 to protect material 36 during subsequent processing operations. The material used for layer 48 may be any one of a variety of materials suitable for use on a semiconductor device, such as a dielectric material, and preferably is TEOS.

Material 36, layer 48, and the underlying dielectric of layer 28 and dielectric 34 will be patterned to form structure 50. A mask 101, such as a photolithographic mask, is formed on layer 48 and patterned to overlie a distal edge of region 32 that is distal from active region 26 so that a first edge 102 of mask 101 overlies region 32 and a second edge 103 overlies a portion of surface 25 that extends laterally away from the distal edge of region 32.

Figure 5:
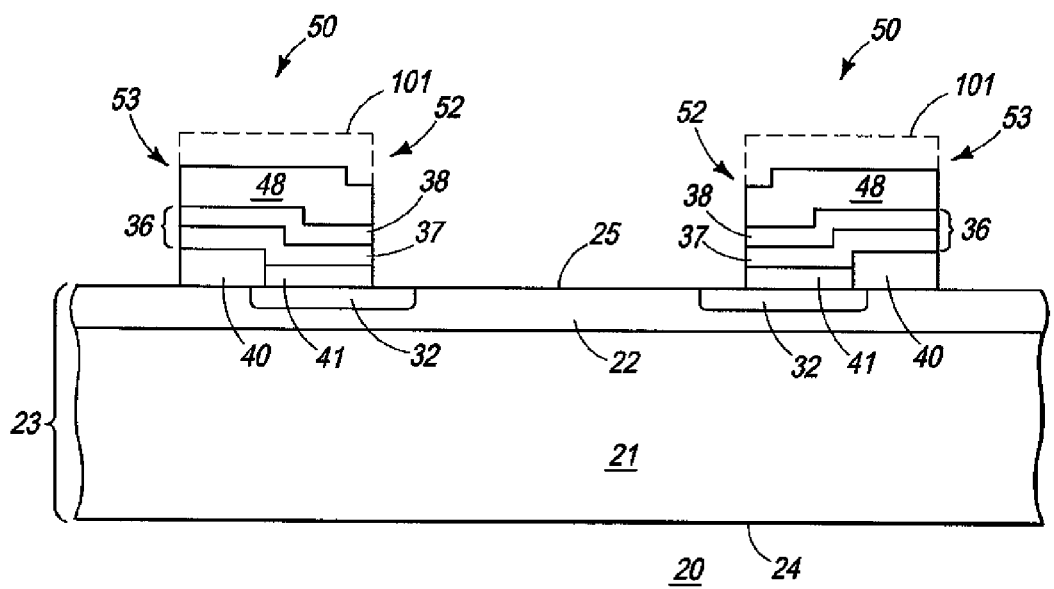

Referring to FIG. 5, mask 101, illustrated by dashed lines, is used to remove portions of dielectric layer 48, material 36, and portions of dielectric layer 28 and dielectric 34. For example an isotropic reactive ion etch be utilized to remove the exposed portions of dielectric layer 48 in addition to the portions of material 36 and the portions of layer 28 and dielectric 34 that underlie the exposed portions of layer 48. Such techniques are well known to those skilled in the art. Thereafter, mask 101 is removed. The remaining portion of layer 28 and dielectric 34 that underlie material 36 are identified as dielectrics 40 and 41, respectively.

Figure 6:
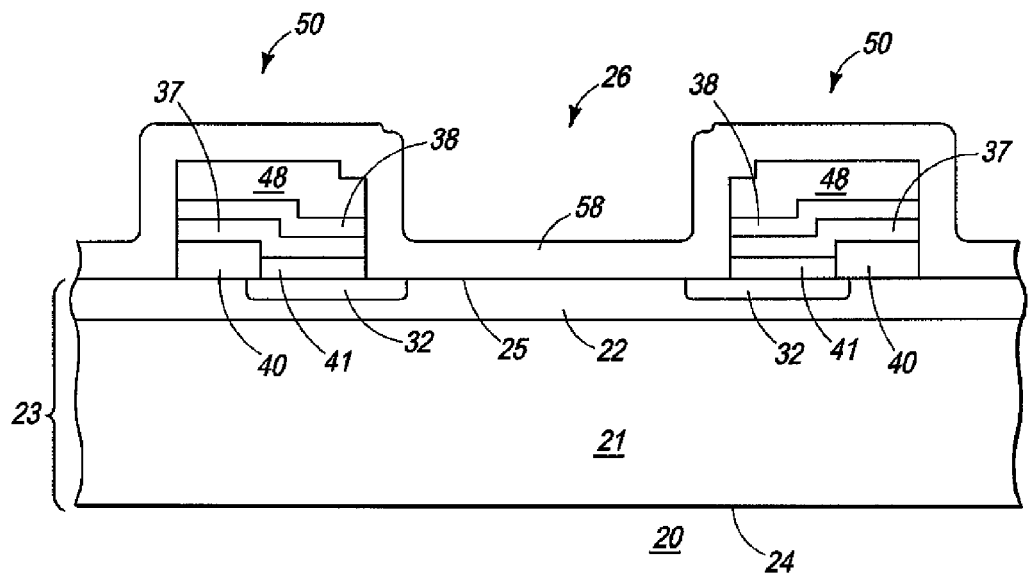
Figure 7:
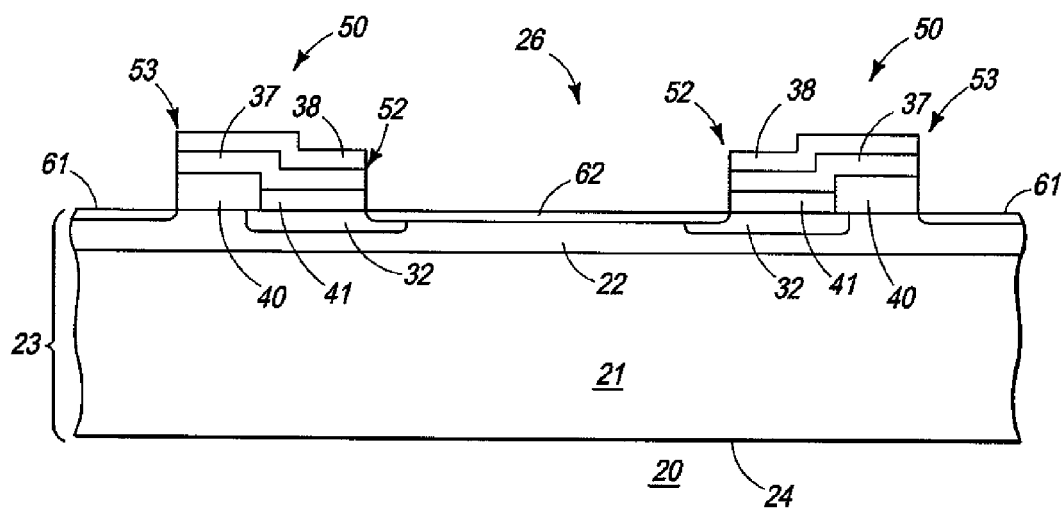

Referring to FIG. 6 and FIG. 7, a Schottky barrier junction is formed at an interface of layer 22 and a Schottky barrier material, such as a silicon-metal alloy 62. Silicon-metal alloy 62 is formed on surface 25 within active region 26. Silicon-metal alloy 62 preferably extends across surface 25 between interior sides 52 of structure 50 (FIG. 7) and into portions of region 32 that do not underlie structure 50. Another silicon-metal alloy 61 (FIG. 7) is formed outside of active region 26 to extend a distance across surface 25 from exterior sides 53 of structure 50. Alloys 61 and 62 may be formed by depositing a metal layer 58 (FIG. 6) onto surface 25 and onto the portion of layer 48 that is on structure 50. The material used for metal layer 58 is a Schottky barrier material that has a low energy barrier in order to form a Schottky barrier junction that results in a low forward voltage for diode 20. The material used for layer 58 preferably forms a metal-silicon alloy with the material of layer 22 and forms the Schottky barrier junction between alloy 62 and layer 22. Suitable materials for layer 58 include refractory metals such as tungsten, titanium, platinum, nickel, cobalt, or other similar materials. Layer 58 generally is heated in order to form metal-silicon alloys 61 and 62. The heating may be formed by a separate annealing operation or may be the result of a subsequent processing step. The portions of layer 58 that do not contact silicon remain as un-reacted portions of layer 58. These un-reacted portions of layer 58 are removed. Those skilled in the art will appreciate that alloys 61 and 62 may be omitted and that a metal layer may be formed within active region 26 and on surface 25 to form a Schottky junction between the metal layer and layer 22.

Subsequently, the portion of protective layer 48 on structure 50 is removed leaving underlying E-field spreading structure 50 on surface 25 with a first side 52 overlying a portion of region 32 and extending across surface 25 over the distal edge of region 32 to have a second side 53 that overlies a portion of layer 22 near region 32. In most embodiments, side 52 is formed to be substantially coplanar to and overlie an edge of layer 22. Those killed in the art will appreciate that structure 50 usually is formed in a geometric pattern that is the same as the pattern of region 32 and extends laterally across the surface of substrate 23. Structure 50 includes a first layer that is formed on surface 25 and includes a portion of dielectric layer 28 and a portion of dielectric 34 as respective dielectrics 40 and 41, and also includes a second layer that is formed by material 36 which abuts dielectrics 40 and 41.

Figure 8:
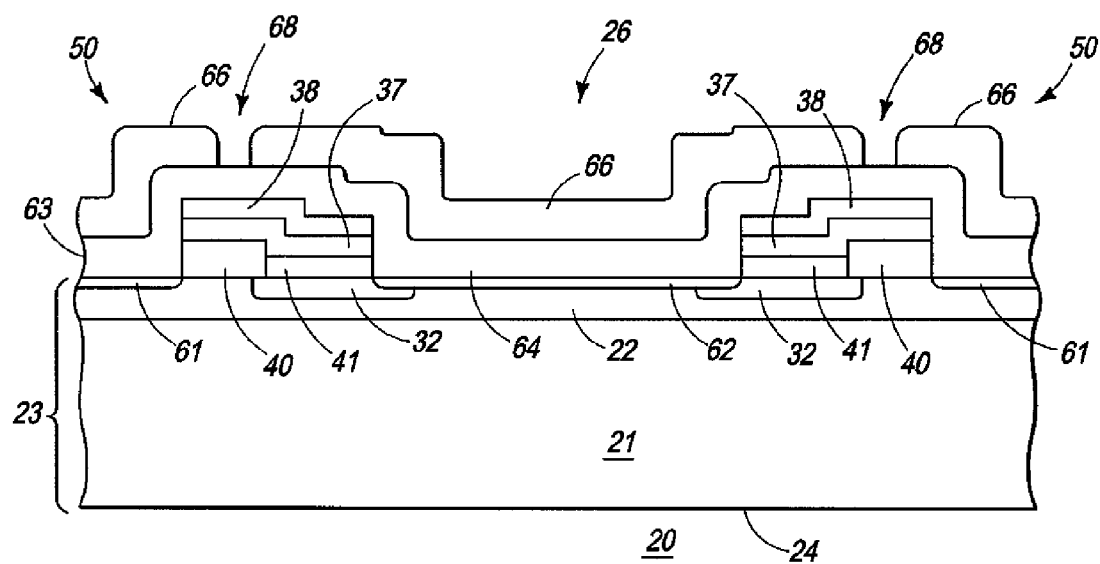

Referring to FIG. 8, conductors 64 and 65 are formed to provide electrical contact to respective metal-silicon alloys 61 and 62. A conductor layer 63 typically is formed on structure 50 and on alloys 61 and 62 by a blanket deposition of a conductor material such as aluminum-silicon or other conductor material. Thereafter, a mask 66, such as a photolithographic mask, is applied to layer 63 and patterned to form an opening 68 through mask 66 and overlying dielectric 40.

Referring back to FIG. 1, an opening is formed through conductor layer 63 using opening 68 through mask 66 (FIG. 8). The opening through layer 63 electrically disconnects portions of layer 63 to form a conductor 64 that is electrically contacting alloy 61 and a conductor 65 that is electrically contacting alloy 62. Thereafter, mask 66 is removed. Opening 70 typically overlies dielectric 40 to ensure that conductor 65 extends onto structure 50 to overlie most of region 32. A conductor 76 may be formed on surface 24. Such a configuration spreads the E-field from alloy 62 further into region 32 thereby reducing the intensity of the E-filed and increasing the reverse breakdown voltage of diode 20. Also, forming dielectric 40 to be thicker than dielectric 41 also assists in spreading the E-field and increases the reverse breakdown voltage.

It has been found that forming semi-insulating material 36 on dielectrics 40 and 41 spreads the E-field and facilitates forming layer 22 to be thin and have a low resistivity to reduce the forward voltage without reducing the reverse breakdown voltage of diode 20. It is believed that this is an unexpected result that is counter to common design practices of the industry. Prior design practices required that the doped region, such as layer 22, be made thick and to have a high resistivity, typically higher than that of the underlying substrate, such as substrate 21, in order to prevent reducing the breakdown voltage. Thus, the results of forming semi-insulating material 36 on dielectrics 40 and 41 and reducing both the thickness and the resistivity of layer 22 without reducing the breakdown voltage is an unexpected result.

Figure 9:
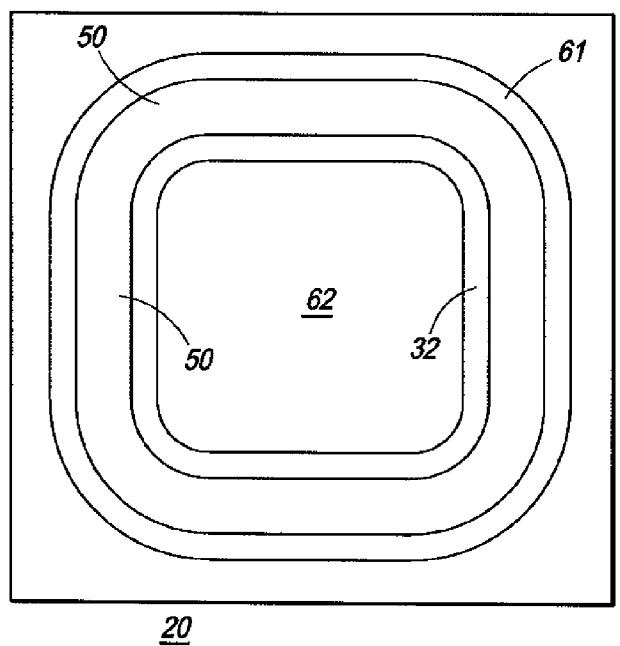
FIG. 9 illustrates an enlarged plan view of an embodiment of a portion of some topographical features of the Schottky diode of FIG. 1 in accordance with the present invention.

FIG. 9 illustrates an enlarged plan view of an embodiment of a portion of some topographical features of diode 20 without conductor 65. Region 32 and structure 50 are formed in a multiply-connected topology that encloses region 26.

In view of all of the above, it is evident that a novel device and method is disclosed. Included, among other features, is forming layer 22 to have a thickness no greater than about eighteen microns and a resistivity that is no greater than about four ohm-cm thereby forming a low forward voltage. Also included is forming a semi-insulating layer abutting a dielectric thereby increasing the breakdown voltage.

While the subject matter of the invention is described with specific preferred embodiments, it is evident that many alternatives and variations will be apparent to those skilled in the semiconductor arts.

The invention claimed is:

1. A method of forming a Schottky diode comprising:
   providing a semiconductor substrate having a first surface;
   forming a first doped region extending into the semiconductor substrate from the first surface and having a resistivity no greater than about two ohm-cm;
   forming a second doped region within the first doped region and extending less than first distance into the semiconductor substrate;
   forming a Schottky barrier material contacting the first doped region;
   forming a dielectric layer on the first surface and extending to overlie the second doped region and have a side substantially coplanar to an edge of the first doped region; and
   forming a semi-insulating layer on the dielectric layer including forming a first semi-insulating layer on the dielectric layer and forming a second semi-insulating layer on the first semi-insulating layer.

2. The method of claim 1 wherein the Schottky diode has a reverse breakdown voltage less than about one hundred volts.

3. The method of claim 1 wherein forming the dielectric layer on the first surface includes forming the dielectric layer having a first portion of a first thickness on the first surface and extending to overlie a first portion of the second doped region and having a second portion of a second thickness overlying a second portion of the second doped region.

4. The method of claim 1 wherein forming the first doped region extending into the semiconductor substrate includes forming the first distance less than about eighteen microns.

5. The method of claim 1 wherein forming the first doped region extending into the semiconductor substrate includes forming the first doped region with a resistivity that is greater than a resistivity of the semiconductor substrate.

6. The method of claim 1 wherein forming the first and second semi-insulating layers includes forming the first semi-insulating layer having a first resistivity and the second semi-insulating layer having a second resistivity.

7. The method of claim 6 wherein forming the first and second semi-insulating layers includes forming the second resistivity greater than about 1E17 ohm-cm.

8. The method of claim 6 wherein forming the first and second semi-insulating layers includes forming the first resistivity lower than the second resistivity.

9. A method of forming a Schottky diode having a breakdown voltage less than about one hundred volts comprising:
   providing a semiconductor substrate having a first surface;
   forming a first doped region extending less than about eighteen microns into the semiconductor substrate from the first surface and having a resistivity no greater than about 0.2 ohm-cm;
   forming a second doped region within the first doped region;
   forming a Schottky barrier material contacting the first doped region;
   forming a dielectric layer on the first surface and extending to overlie the second doped region and have an edge substantially coplanar to an edge of the first doped region; and
   forming a semi-insulating layer on the dielectric layer including forming a first semi-insulating layer of a first resistivity disposed on the dielectric layer and forming a second semi-insulating layer of a second resistivity that is greater than the first resistivity wherein the second resistivity is no less than about 1E17 ohm-cm.

10. The method of claim 9 wherein forming the dielectric layer includes forming the dielectric layer having a first portion of a first thickness on the first surface and extending to overlie a first portion of the second doped region and having a second portion of a second thickness overlying a second portion of the second doped region.

* * * * *